United States Patent
Varanasi et al.

[11] Patent Number: 6,124,074
[45] Date of Patent: Sep. 26, 2000

[54] PHOTORESIST COMPOSITIONS WITH CYCLIC OLEFIN POLYMERS AND HYDROPHOBIC NON-STEROIDAL MULTI-ALICYCLIC ADDITIVES

[75] Inventors: Pushkara Rao Varanasi, Poughkeepsie; Joseph F. Maniscalco, Lake Katrine, both of N.Y.

[73] Assignee: International Business Machines Corporation, Armonk, N.Y.

[21] Appl. No.: 09/266,341

[22] Filed: Mar. 11, 1999

[51] Int. Cl.[7] ............... G03C 1/73; G03C 1/74; G03C 1/76; G03C 5/56; G03C 5/16
[52] U.S. Cl. .................... 430/270.1; 430/271.1; 430/905; 430/914; 430/326; 430/11; 430/17
[58] Field of Search .............. 430/270.1, 914, 430/271.1, 905, 907, 286.1, 11, 14, 18, 17, 326

[56] References Cited

U.S. PATENT DOCUMENTS

| | | | |
|---|---|---|---|
| 4,400,461 | 8/1983 | Chandross et al. | 430/311 |
| 4,855,017 | 8/1989 | Douglas | 156/643 |
| 5,310,619 | 5/1994 | Crivello et al. | 430/270 |
| 5,362,663 | 11/1994 | Bronner et al. | 437/52 |
| 5,399,647 | 3/1995 | Nozaki | 526/297 |
| 5,429,710 | 7/1995 | Akiba et al. | 216/17 |
| 5,468,819 | 11/1995 | Goodall et al. | 526/171 |
| 5,562,801 | 10/1996 | Nulty | 156/643.1 |
| 5,580,694 | 12/1996 | Allen et al. | 430/270.1 |
| 5,585,219 | 12/1996 | Kaimoto et al. | 438/392 |
| 5,618,751 | 4/1997 | Golden et al. | |
| 5,705,503 | 1/1998 | Goodall et al. | 526/281 |
| 5,738,975 | 4/1998 | Nakano et al. | 430/280.1 |
| 5,744,376 | 4/1998 | Chan et al. | 437/190 |
| 5,750,680 | 5/1998 | Kim et al. | 540/200 |
| 5,770,346 | 6/1998 | Iwasa et al. | 430/270.1 |
| 5,776,657 | 7/1998 | Schaedeli et al. | 430/281.1 |
| 5,786,131 | 7/1998 | Allen et al. | 430/325 |
| 5,801,094 | 9/1998 | Yew et al. | 438/624 |
| 5,821,469 | 10/1998 | Shanmugam | 174/135 |
| 5,830,965 | 11/1998 | Imaizumi et al. | 526/309 |
| 5,837,419 | 11/1998 | Ushirogouchi et al. | 430/270.1 |
| 5,843,624 | 12/1998 | Houlihan et al. | 430/296 |
| 5,863,699 | 1/1999 | Asakawa et al. | 430/270.1 |

FOREIGN PATENT DOCUMENTS

| | | | |
|---|---|---|---|
| WO 97/33198 | 9/1997 | European Pat. Off. | G03F 7/039 |
| 0 880 074 A1 | 11/1998 | European Pat. Off. | G03F 7/004 |
| 10239845 | 9/1998 | Japan | G03F 7/039 |
| 10301283 | 11/1998 | Japan | G03F 7/039 |

*Primary Examiner*—Janet Baxter
*Assistant Examiner*—Sin J. Lee
*Attorney, Agent, or Firm*—Steven Capella

[57] ABSTRACT

Acid-catalyzed positive photoresist compositions which are imageable with 193 nm radiation and are developable to form photoresist structures of high resolution and high etch resistance are enabled by the use of a combination of cyclic olefin polymer, photosensitive acid generator and a hydrophobic non-steroidal multi-alicyclic component containing plural acid labile linking groups. The cyclic olefin polymers preferably contain i) cyclic olefin units having polar functional moieties, ii) cyclic olefin units having acid labile moieties that inhibit solubility in aqueous alkaline solutions.

15 Claims, No Drawings

PHOTORESIST COMPOSITIONS WITH CYCLIC OLEFIN POLYMERS AND HYDROPHOBIC NON-STEROIDAL MULTI-ALICYCLIC ADDITIVES

CROSS REFERENCE TO RELATED APPLICATIONS

Filed simultaneously with this application are U.S. patent application Ser. No. 09/266,343 (Atty. Docket No., FI9-99-086) titled "Photoresist Compositions with Cyclic Olefin Polymers and Hydrophobic Non-Steroidal Alicyclic Additives"; U.S. patent application Ser. No. 09/266,342, (Atty. Docket No., FI9-99-085) titled "Photoresist Compositions with Cyclic Olefin Polymers and Additive"; and U.S. patent application Ser. No. 09/266,344, (Atty. Docket No., FI9-99-088) titled "Photoresist Compositions with Cyclic Olefin Polymers and Saturated Steroid Additives". The disclosures of the above applications are incorporated herein by reference.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of photolithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for photolithographic processes. Recently, the trend has been to move from so-called I-line radiation (350 nm) to 248 nm radiation.

For future reductions in size, the need to use 193 nm radiation appears likely. Unfortunately, photoresist compositions at the heart of current 248 nm photolithographic processes are typically unsuitable for use at shorter wavelengths.

While a photoresist composition must possess desirable optical characteristics to enable image resolution at a desired radiation wavelength, the photoresist composition must also possess suitable chemical and mechanical properties to enable transfer to the image from the patterned photoresist to an underlying substrate layer(s). Thus, a patternwise exposed positive photoresist must be capable of appropriate dissolution response (i.e. selective dissolution of exposed areas) to yield the desired photoresist structure. Given the extensive experience in the photolithographic arts with the use of aqueous alkaline developers, it is important to achieve appropriate dissolution behavior in such commonly used developer solutions.

The patterned photoresist structure (after development) must be sufficiently resistant to enable transfer of the pattern to the underlying layer(s). Typically, pattern transfer is performed by some form of wet chemical etching or ion etching. The ability of the patterned photoresist layer to withstand the pattern transfer etch process (i.e., the etch resistance of the photoresist layer) is an important characteristic of the photoresist composition.

While some photoresist compositions have been designed for use with 193 nm radiation, these compositions have generally failed to deliver the true resolution benefit of shorter wavelength imaging due to a lack of performance in one or more of the above mentioned areas. Thus, there is a need for photoresist compositions that are imageable with shorter wavelength radiation (e.g., 193 nm ultraviolet radiation) while possessing good developability and etch resistance.

SUMMARY OF THE INVENTION

The invention provides photoresist compositions which are capable of high resolution lithographic performance, especially using 193 nm imaging radiation. The photoresist compositions of the invention possess the combination of imageability, developability and etch resistance needed to provide pattern transfer at very high resolutions which are limited only by the wavelength of imaging radiation. The photoresist compositions of the invention are generally characterized by the presence of (a) cyclic olefin polymers, and (b) a hydrophobic non-steroidal multi-alicyclic component containing plural acid labile links ("HNMP").

The invention also provides photolithographic methods using the photoresist compositions of the invention to create photoresist structures and methods using the photoresist structures to transfer patterns to an underlying layer(s). The photolithographic methods of the invention are preferably characterized by the use of 193 nm ultraviolet radiation patternwise exposure. The methods of the invention are preferably capable of resolving features of less than about 150 nm in size, more preferably less than about 115 nm in size (using 0.68 numerical aperture optics) without the use of a phase shift mask.

In one aspect, the invention encompasses a photoresist composition comprising:
(a) a cyclic olefin polymer comprising:
   i) cyclic olefin units having polar functional moieties, and
   ii) cyclic olefin units having acid labile moieties that inhibit solubility in aqueous alkaline solutions,
(b) a photoactive component, and
(c) a hydrophobic non-steroidal multi-alicyclic component containing plural acid labile links.

The cyclic olefin polymers of the invention preferably consist essentially of cyclic olefin monomeric units; more preferably they consist essentially of units i) and ii). Units i) preferably comprise acidic polar moieties having a $pK_a \leq 13$. The HNMP component preferably comprises at least two $C_7$ or higher alicyclic moieties. Acid cleaving of the HNMP component preferably results in the formation of a compound having plural acidic polar functional groups and/or plural compounds each having at least one acidic polar group.

In another aspect, the invention encompasses a method of creating a patterned photoresist structure on a substrate, the method comprising:
(a) providing a substrate having a surface layer of the photoresist composition of the invention,
(b) patternwise exposing the photoresist layer to radiation whereby portions of the photoresist layer are exposed to radiation, and
(c) contacting the photoresist layer with an aqueous alkaline developer solution to remove the exposed portions of the photoresist layer to create the patterned photoresist structure.

Preferably, the radiation used in step (b) in the above method is 193 nm ultraviolet radiation.

The invention also encompasses processes for making conductive, semiconductive, magnetic or insulative structures using the patterned photoresist structures containing the compositions of the invention.

These and other aspects of the invention are discussed in further detail below.

DETAILED DESCRIPTION OF THE INVENTION

The photoresist compositions of the invention are generally characterized by the presence of (a) a cyclic olefin polymer, and (b) a hydrophobic non-steroidal multi-alicyclic component containing plural acid labile links. The cyclic olefin polymer preferably contains i) cyclic olefin units having polar functional moieties, and ii) cyclic olefin units having acid labile moieties that inhibit solubility in aqueous alkaline solutions. These compositions are especially capable of providing high resolution photolithographic patterns using 193 nm radiation with good developability and pattern transfer characteristics.

The invention further encompasses patterned photoresist structures containing the photoresist compositions of the invention, as well as processes for creating the photoresist structures and using the photoresist structures to form conductive, semiconductive and/or insulative structures.

The photoresist compositions of the invention preferably comprise:

(a) a cyclic olefin polymer comprising:
  i) cyclic olefin units having polar functional moieties selected from acidic moieties that promote solubility in aqueous alkaline solutions and non-acidic polar moieties, and
  ii) cyclic olefin units having acid labile moieties that inhibit solubility in aqueous alkaline solutions,
(b) a photoactive component, and
(c) a hydrophobic non-steroidal multi-alicyclic component containing plural acid labile links (HMNP).

Cyclic olefin units i) may be any cyclic olefin monomeric unit having an acidic polar functional group that promotes alkaline solubility or cyclic olefin monomeric unit having a non-acidic polar group. Examples of cyclic olefin monomers include the following monomers illustrated by structure (I) below where $R_1$ represents a polar moiety and n is zero or some positive integer:

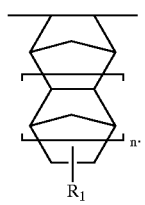
(I)

More preferably, the cyclic olefin units i) are selected from:

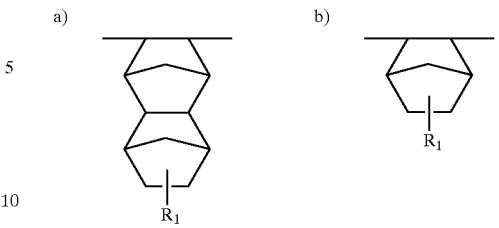
(II)

where $R_1$ represents either an acidic polar moiety which promotes solubility in aqueous alkaline solutions or a non-acidic polar group. Preferred acidic polar moieties have a $pK_a \leq 13$. Preferred acidic polar groups contain a selected from the group consisting of carboxyl, sulfonamidyl, fluoroalcohol, and other acidic polar groups. Preferred acidic polar moieties are carboxyl groups. Non-acidic polar moieties preferably have a $pK_a > 13$ and contain at least one heteroatom such as oxygen, nitrogen or sulfur. If desired, combinations of cyclic olefin units i) having differing polar functional groups may be used. Preferably, at least some or all of cyclic olefin units i) have acidic polar functionality.

Cyclic olefin units ii) may be any cyclic olefin monomeric unit having an acid labile moiety that inhibit solubility in aqueous alkaline solutions. Examples of cyclic olefin monomers include the following monomers illustrated by structure (III) below where $R_2$ represents a an acid-labile protecting moiety and n is zero or some positive integer:

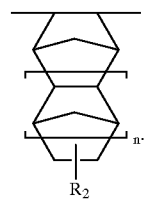
(III)

More preferably, the cyclic olefin units ii) are selected from:

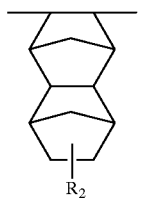 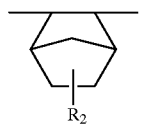
(IV)

where $R_2$ represents an acid-labile protecting moiety. Preferred acid-labile protecting moieties are selected are selected from the group consisting of tertiary alkyl (or cycloalkyl) carboxyl esters (e.g., t-butyl, methyl cyclopentyl, methyl cyclohexyl, methyl adamantyl), ester ketals, and ester acetals. Tertiary butyl carboxyl ester is a most preferred acid-labile protecting moiety. If desired, combinations of cyclic olefin units ii) having differing protecting functional groups may be used.

For photolithographic applications used in the manufacture of integrated circuit structures and other microscopic structures, the cyclic olefin polymers of invention preferably contain at least about 20 mole % of cyclic olefin units ii), more preferably about 40–90 mole %, most preferably about 60–90 mole %. The cyclic olefin polymers of the invention preferably contain about 10–80 mole % of cyclic olefin units i), more preferably about 10–60 mole %. Where cyclic olefin units i) comprise units having a carboxylic acid polar group, those units are preferably present at about 5 to 30 mole %, more preferably about 10–25 mole %, most preferably about 10–20 mole %, based on the overall cyclic olefin polymer composition. Where cyclic olefin units i) comprise units having a sulfonamidyl acidic polar group, those unites are preferably present at about 15 to 50 mole %, more preferably about 20–40 mole %, based on the overall cyclic olefin polymer composition. The cyclic olefin polymers of the invention may contain other monomeric units in addition to units i) and ii). Preferably, the cyclic olefin polymers of the invention contain about 40 mole % or less of such other monomeric units, more preferably about 20 mole % or less. Most preferably, the cyclic olefin polymers of the invention consist essentially of cyclic olefin units i) and ii).

The photoresist compositions of the invention are further characterized by the presence of a hydrophobic non-steroidal multi-alicyclic component containing plural acid labile linking groups ("HNMP"). The HNMP component generally enables and/or enhances the ability to resolve ultrafine lithographic features in response to conventional aqueous alkaline developers. The HNMP component is characterized by the presence at least two distinct non-steroidal alicyclic structures (i.e. structures that do not contain the $C_{17}$ condensed cyclic structure characteristic of steroid compounds). The alicyclic ring structures each preferably contain at least 7 carbon atoms ($C_7$), more preferably about 10–30 carbon atoms, excluding pendant groups. The overall HNMP component preferably contains about 20–60 carbon atoms.

Broadly, the HNMP component encompasses compounds containing at least two acid labile linking groups and at least two alicyclic moieties such that an acid labile link exists between at least two alicyclic moieties.

The HNMP compound contains plural acid labile linking moieties and plural alicyclic moieties. One structure of the compound may be represented by:

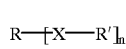

(V)

The bond between R and X is acid labile such that at least one $X_c$—R' derivative is formed by acid cleaving of the R—X bond where $X_c$ is an acidic polar pendant group from R'. n is at least 2. If R contains an alicyclic moiety, then at least one R' comprises an alicyclic moiety. If R does not contain an alicyclic moiety, then at least two R' groups each comprise an alicyclic moiety. Where X is a carboxylic group, the structure becomes:

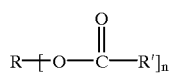

(VI)

where the bond at R—O is acid labile. After cleaving, a carboxylic acid group would remain pendant on R'. Where n is 2 and R' comprises adamantane moieties, a structure might be as follows:

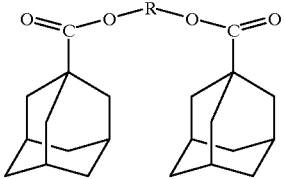

(VII)

where R preferably is a combination of acid labile ester groups such as two t-butyl ester groups bonded together (structure VIIa below where 1 indicates the location of acid labile linking sites) or some other acid labile linkage. The result of cleaving would be plural compounds containing R' moieties with pendant carboxylic acid groups.

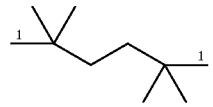

(VIIa)

Alternatively, the HNMP compound may have a structure

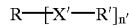

(VIII)

where the bond between R' and X' is acid labile such that an R—$(X_c)_{n'}$ derivative is formed by acid cleaving of the R'—X' bond where $X_c$ is an acidic polar pendant group from R. n' is at least 2. At least one R' comprises an alicyclic moiety and at least one total of either R or the remaining R' moieties comprises an alicyclic moiety. The end result after cleaving in any case would be the creation of two smaller molecules each containing an alicyclic moiety and the creation of plural polar functional groups pendant from R.

Where X is a carboxylic group, the structure becomes:

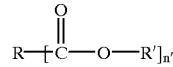

(IX)

After cleaving, R would contain plural (n') carboxylic acid pendant groups. Where R is a norbornyl alicyclic, n'=2 and each R' contains adamantane, an HNM additive could have the following structure:

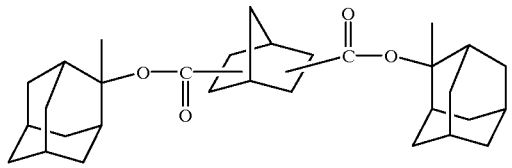

(X)

After cleaving, the norbornyl compound would have two pendant carboxylic acid groups.

Examples of other possible HNMP additive structures include:

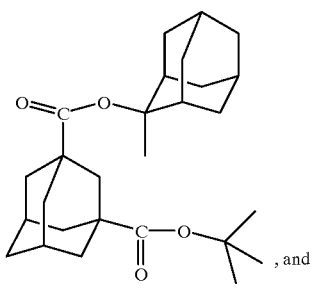

(XI)

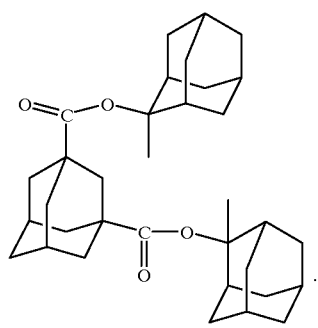

, and (XII)

In the HNMP compounds used in the invention, the acid labile linking groups advantagously react with acid generated in the photolithographic process whereby the moiety undergoes cleaving to provide molecules or substantially reduced molecular weight which then act to promote alkaline solubility of radiation-exposed portions of the photoresist. Preferred acid labile linking moieties contain at least one moiety selected from the group consisting of tertiary alkyl (or cycloalkyl) carboxyl esters (e.g., t-butyl, methyl cyclopentyl, methyl cyclohexyl, methyl adamantyl), ester ketals, and ester acetals. HNMP components may also contain pendant groups which increase the bulk of the molecule and/or increase the hydrophobicity of the molecule in a way that enhances performance of the photoresist composition. If desired, a combination of HNMP components can be used.

Examples of preferred HNMP components include bis-carboxyl esters of adamantanes and higher fused ring systems. A most preferred HNMP component is bis-adamantane t-butyl carboxylate.

In addition to the cyclic olefin polymers, the photoresist compositions of the invention contain a photosensitive acid generator (PAG). The invention is not limited to the use of any specific PAG or combination of PAG's, that is the benefits of the invention may be achieved using various photosensitive acid generators known in the art. Preferred PAG's are those which contain reduced amounts (or preferably no) aryl moieties. Where aryl-containing PAG is employed, the absorptive characteristics of the PAG at 193 nm may restrict the amount of PAG that can be included in the formulation.

Examples of suitable photosensitive acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate, etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α–α' bis-sulfonyl diazomethanes, naphthoquinone-4-diazides, alkyl disulfones and others.

The photoresist compositions of the invention will typically contain a solvent prior to their application to the desired substrate. The solvent may be any solvent conventionally used with acid-catalyzed photoresists which otherwise does not have any excessively adverse impact on the performance of the photoresist composition. Preferred solvents are propylene glycol monomethyl ether acetate, cyclohexanone, and ethyl cellosolve acetate.

The compositions of the invention may further contain minor amounts of auxiliary components such as dyes/sensitizers, base additives, etc. as are known in the art. Preferred base additives are weak bases which scavenge trace acids while not having an excessive impact on the performance of the photoresist. Preferred base additives are (aliphatic or alicyclic) tertiary alkyl amines or t-alkyl ammonium hydroxides such as t-butyl ammonium hydroxide (TBAH).

The photoresist compositions of the invention preferably contain about 0.5–20 wt. % (more preferably about 3–15 wt. %) photosensitive acid generator based on the total weight of cyclic olefin polymer in the composition. Where a solvent is present, the overall composition preferably contains about 50–90 wt. % solvent. The composition preferably contains about 1 wt. % or less of said base additive based on the total weight of acid sensitive polymer. The photoresist compositions of the invention preferably contain at least about 5 wt. % of HNMP component based on the total weight of cyclic olefin polymer in the composition, more preferably about 10–25 wt. %, most preferably about 10–20 wt. %.

The invention is not limited to any specific method of synthesizing the cyclic olefin polymers used in the invention. Preferably, the cyclic olefin polymers are formed by addition polymerization. Examples of suitable techniques are disclosed in U.S. Pat. Nos. 5,468,819 and 5,705,503 assigned to B.F. Goodrich Company, the disclosures of which are incorporated herein by reference.

The cyclic olefin polymers of the invention preferably have a weight average molecular weight of about 5,000–100,000, more preferably about 10,000–50,000.

The photoresist compositions of the invention can be prepared by combining the cyclic olefin polymer, PAG, HNMP component and any other desired ingredients using conventional methods. The photoresist composition to be used in photolithographic processes will generally have a significant amount of solvent.

The photoresist compositions of the invention are especially useful for photolithographic processes used in the manufacture of integrated circuits on semiconductor substrates. The compositions are especially useful for photolithographic processes using 193 nm UV radiation. Where use of other radiation (e.g. mid-UV, 248 nm deep UV, x-ray, or e-beam) is desired, the compositions of the invention can be adjusted if necessary by the addition of an appropriate dye or sensitizer to the composition. The general use of the photoresist compositions of the invention in photolithography for semiconductors is described below.

Semiconductor photolithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the photoresist layer. The ARC layer may be any conventional ARC which is compatible with acid catalyzed photoresists.

Typically, the solvent-containing photoresist composition is applied to the desired semiconductor substrate using spin coating or other technique. The substrate with the photoresist coating is then preferably heated (pre-exposure baked) to remove the solvent and improve the coherence of the photoresist layer. The thickness of the applied layer is preferably as thin as possible with the provisos that the thickness is preferably substantially uniform and that the photoresist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the photoresist. Preferably, the pre-exposure bake is performed at temperatures which are at least 20° C. below $T_g$.

After solvent removal, the photoresist layer in then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the photoresist layer. For 193 nm UV radiation, the total exposure energy is preferably about 100 millijoules/$cm^2$ or less, more preferably about 50 millijoules/$cm^2$ or less (e.g. 15–30 millijoules/$cm^2$).

After the desired patternwise exposure, the photoresist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the photoresist structure with the desired pattern is obtained (developed) by contacting the photoresist layer with an alkaline solution which selectively dissolves the areas of the photoresist which were exposed to radiation. Preferred alkaline solutions (developers) are aqueous solutions of tetramethyl ammonium hydroxide. Preferably, the photoresist compositions of the invention can be developed with conventional 0.26N aqueous alkaline solutions. The photoresist compositions of the invention can also be developed using 0.14N or 0.21N or other aqueous alkaline solutions. The resulting photoresist structure on the substrate is then typically dried to remove any remaining developer solvent. The photoresist compositions of the invention are generally characterized in that the product photoresist structures have high etch resistance. In some instances, it may be possible to further enhance the etch resistance of the photoresist structure by using a post-silylation technique using methods known in the art. The compositions of the invention enable the reproduction of lithographic features The pattern from the photoresist structure may then be transferred to the material (e.g., ceramic, metal or semiconductor) of the underlying substrate. Typically, the transfer is achieved by reactive ion etching or some other etching technique. In the context of reactive ion etching, the etch resistance of the photoresist layer is especially important. Thus, the compositions of the invention and resulting photoresist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of photoresist over the material layer or section, patternwise exposing the photoresist to radiation, developing the pattern by contacting the exposed photoresist with a solvent, etching the layer(s) underlying the photoresist layer at spaces in the pattern whereby a patterned material layer or substrate section is formed, and removing any remaining photoresist from the substrate. In some instances, a hard mask may be used below the photoresist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

To a suspension containing 50 g (0.342 mol) of 2,6-dimethyl-2,5-hexanediol in 600 ml of methylene chloride, 76.14 g (0.762 mol) of triethylamine was added at room temperature. The resultant suspension was stirred at room temperature until it turned into clear solution. 149.5 g (0.7524 mol) of adamantane-1-carbonyl chloride was added to the above solution at 0° C. After the addition was complete, the reaction mixture was stirred at room temperature for 12 hours, and subsequently under refluxing conditions for 2 hours. The reaction mixture was filtered to remove the triethylamine hydrochloride formed during the reaction. The filtrate was washed with water (×500 ml) several times, dried over anhydrous sodium sulfate, and then concentrated under reduced pressure. Purification of the residue through a column chromatography (silica gel; hexane/methylene chloride: 9:1) resulted in 128 g (~80%) of white sold which was identified as 2,5-bis(adamantane-1-carboxyloxy)-2,5-dimethylhexane by NMR spectroscopy.

EXAMPLE 2

(Comparison)

For the purpose of lithographic experiments, a photoresist formulation containing norbornene copolymers containing 85% of norbornene t-butylester (NB-t-BE) and 15% of norbornene-carboxylic acid (as pendant groups) (NB-CA) was prepared by combining the materials set forth below, expressed in part by weight.

| | |
|---|---|
| Propylene glycol monomethyl ether acetate | 37 |
| Copolymers of NB-t-BE and NB—CA(85/15) | 4 |
| Di-t-butylphenyliodonium perfluorooctanesulfonate | 0.16 |
| Tetrabutyl ammonium hydroxide | 0.008 |

The photoresist formulations were spin-coated (for 30 seconds) onto an antireflective material (ArX®, Shipley Company) layer applied on silicon wafers. The photoresist layer was soft baked at 130° C. for 60 seconds on a vacuum hot plate to produce film of about 0.4 μm thickness. The wafers were then exposed to 193 nm radiation (0.6NA ArF, ISI stepper). The exposure pattern was an array of lines and spaces of varying dimensions down to 0.1 μm. The exposed wafers were post-exposure baked on a vacuum hot plate at 150° C. for 90 seconds. The pattern exposed photoresist was then (puddle) developed using 0.263N tetramethyl ammonium hydroxide developer. The pattern was then examined by scanning electron microscopy (SEM). The cross-sectioned SEM pattern indicated no resolution below 200 nm L/S (lines-space pairs) due to lines falling over each other. Even lines-space pairs above 200 nm were not fully resolved because of excessive scumming/residues between the lines.

EXAMPLE 3

This example demonstrates the benefit of the additives of the invention. The photoresist formulation was prepared by combining the materials set forth below, expressed in part by weight.

| | |
|---|---|
| Propylene glycol monomethyl ether acetate | 38 |
| Poly(norbornene) with t-BE and CA groups(t-BE/CA: 85/15) | 4 |
| Di-t-butylphenyliodonium perfluorooctanesulfonate | 0.16 |
| 2,5-Bis(adamanatane-1-carboxyloxy)-2,5-dimethylhexane (example 1) | 0.4 |
| Tetrabutylammoniumhydroxide | 0.008 |

The photoresist formulations were spin-coated onto anti-reflective material (ArX®, Shipley Company) on silicon wafers, pattern-wise exposed (193 nm radiation), and developed in the same manner as in example 2. The resulting pattern was then examined by scanning electron microscopy (SEM). Line-space pairs of 130 nm and above were well resolved with clean profiles. The exposure energy required for this formulation is in the range of 20–30 mJ/cm².

What is claimed is:

1. A photoresist composition comprising (a) a cyclic olefin polymer comprising (i) cyclic olefin units having polar functional moieties, and (ii) cyclic olefin units having acid labile moieties that inhibit solubility in aqueous alkaline solutions, (b) a photosensitive acid generator, and (c) a hydrophobic non-steroidal multi-alicyclic component containing plural acid labile linking groups, said multi-alicyclic component comprising at least two non-steroidal $C_7$ or higher alicyclic moieties.

2. The composition of claim 1 wherein said cyclic olefin polymer consists essentially of cyclic olefin units i) and cyclic olefin units ii).

3. The composition of claim 1 wherein said polar functional moieties are selected from the group consisting of acidic polar functional moieties having a $pK_a$ of about 13 or less and non-acidic polar functional moieties having a $pK_a$ greater than 13 or combinations thereof.

4. The composition of claim 3 wherein said cyclic olefin units i) contain an acidic polar functional moiety comprising an acidic polar group selected from the group consisting of carboxyl, sulfonamidyl, fluoroalcohol, and other acidic polar groups.

5. The composition of claim 4 wherein said acidic polar group is a carboxyl group.

6. The composition of claim 1 wherein said cyclic olefin units ii) contain an acid-labile protecting group containing a moiety selected from the group consisting of tertiary alkyl carboxyl esters, tertiary cycloalkyl carboxyl, ester ketals, and ester acetals.

7. The composition of claim 1 wherein said hydrophobic non-steroidal multi-alicyclic component comprises two acid labile linking moieties.

8. The composition of claim 7 wherein said hydrophobic non-steroidal alicyclic component comprises acid labile linking moieties selected from the group consisting of tertiary alkyl carboxyl esters, tertiary cycloalkyl carboxyl, ester ketals, and ester acetals.

9. The composition of claim 1 wherein said hydrophobic non-steroidal alicyclic component comprises at least two non-steroidal $C_{10}$–$C_{30}$ alicyclic moieties.

10. The composition of claim 7 wherein said two acid labile linking moieties are two tertiary alkyl carboxyl esters bonded to each other.

11. The composition of claim 1 wherein said composition comprises about 5–25 wt. % of said hydrophobic non-steroidal alicyclic component based on the weight of said cyclic olefin polymer.

12. The composition of claim 1 wherein said cyclic olefin polymer contains about 10–80 mole % of cyclic olefin units i) and about 20–90 mole % of cyclic olefin units ii).

13. A patternwise radiation-exposed and developed positive photoresist structure on a substrate, said photoresist comprising (a) a cyclic olefin polymer comprising (i) cyclic olefin units having polar functional moieties, and (ii) cyclic olefin units having acid labile moieties that inhibit solubility in aqueous alkaline solutions, (b) a photosensitive acid generator, and (c) a hydrophobic non-steroidal multi-alicyclic component containing plural acid labile linking groups, said multi-alicyclic component comprising at least two non-steroidal $C_7$ or higher alicyclic moieties.

14. The structure of claim 13 wherein said cyclic olefin polymer consists essentially of cyclic olefin units i) and cyclic olefin units ii).

15. The structure of claim 13 wherein said cyclic olefin units ii) contain an acid-labile protecting group containing a moiety selected from the group consisting of tertiary alkyl carboxyl esters, tertiary cycloalkyl carboxyl, ester ketals, and ester acetals.

* * * * *